United States Patent [19]
Shih et al.

[11] Patent Number: 6,100,118
[45] Date of Patent: Aug. 8, 2000

[54] FABRICATION OF METAL FUSE DESIGN FOR REDUNDANCY TECHNOLOGY HAVING A GUARD RING

[75] Inventors: Cheng-Yeh Shih; Jenn Ming Huang, both of Hsin-Chu, Taiwan

[73] Assignee: Taiwan Semiconductor Manufacturing Company, Ltd., Hsin-Chu, Taiwan

[21] Appl. No.: 09/094,465

[22] Filed: Jun. 11, 1998

[51] Int. Cl.[7] ................................................... H01L 21/82
[52] U.S. Cl. .............................................. 438/132; 438/601
[58] Field of Search ..................................... 438/132, 215, 438/281, 454, 601, 655, 958

[56] References Cited

U.S. PATENT DOCUMENTS

| | | | |
|---|---|---|---|
| 4,536,949 | 8/1985 | Takayama et al. | 438/601 |
| 5,444,012 | 8/1995 | Yoshizumi et al. | 438/601 |
| 5,457,059 | 10/1995 | Keller et al. | 438/601 |
| 5,538,924 | 7/1996 | Chen | 438/132 |
| 5,567,643 | 10/1996 | Lee et al. | 438/601 |
| 5,712,206 | 1/1998 | Chen | 438/601 |
| 5,851,903 | 12/1998 | Stamper | 438/132 |

*Primary Examiner*—Chandra Chaudhari
*Attorney, Agent, or Firm*—George O. Saile; Stephen B. Ackerman; William J. Stoffel

[57] ABSTRACT

A method of fabricating a metal guard ring (e.g., 139 149 159) around for a metal fuse 141 and fuse opening 88. The metal fuse 41 is formed from a second metal layer (M2) (or M3 or M4, etc.) and is connected to an underlying polysilicon layer 22 by fuse interconnections 129A 129B. The method comprises:

a) forming a first polysilicon line 22A and a second polysilicon line 22B over at least the fuse area 84 insulated (e.g., 20) from a substrate 10;

b) forming one or more levels of fuse interconnects (129A 129B) electrically connected to the first polysilicon line 22A and the second polysilicon line 22B; the fuse interconnects 129A 129B passing through vias in one or more insulating layers 24 34;

c) simultaneously forming a metal fuse 141 connecting the polysilicon interconnects 129A 129B over the fuse area 84 and forming a first guard ring 139 around a fuse area 84;

d) forming an dielectric layer 144 over the metal fuse 141 and the first guard ring 139;

e) forming a guard ring around the fuse areas 84; the guard ring composed of a plurality of metal wiring layers 149 159 formed on and through vias in a plurality of dielectric layers 144 154; and f) forming a fuse opening 88 through at least a portion of the plurality of dielectric layers 144 154 172 in the fuse area.

10 Claims, 4 Drawing Sheets

FABRICATION OF METAL FUSE DESIGN FOR REDUNDANCY TECHNOLOGY HAVING A GUARD RING

BACKGROUND OF INVENTION

1) Field of the Invention

This invention relates generally to fabrication and design of metal fuses for semiconductor devices and particularly to the fabrication of a metal fuse having a guard ring composed of metal layers and vias.

2) Description of the Prior Art

Fuses can be used to rewire memory and logic circuits. For example, in dynamic or static memory chips, defective memory cells may be replaced by blowing fuses associated with the defective cells, and activating a spare row or column of cells. This circuit rewiring using fusible links allows considerable enhanced yields and reduces the production costs. Also, logic circuits may also be repaired or reconfigured by blowing fuses. For example, it is common to initially fabricate a generic logic chip having a large number of interconnected logic gates. Then, in a final processing step, the chip is customized to perform a desired logic function by disconnecting the unnecessary logic elements by blowing the fuses that connect them to the desired circuitry. Still other applications of laser-blown fuses are possible. There are two methods for blowing fuses: (a) using a laser and (b) passing a high current through the fuse. The portion of the fuse and thin insulating layer which is melted away or "blown" must not deposit or interfere with near-by devices. A laser is often used to break the fuse forming an electrical open by heating the fuse to a high temperature. It is conventional to have an opening through insulating over the fuse in the area where the fuse will be broken.

The inventor has found major problems in the process of forming opening (e.g., fuse openings 88) over fuses. As the number of metal layers and inter metal dielectric layers (IMD) increases, it is more difficult to accurately etch the fuse opening to a precise depth. Moreover, because of the additional inter metal dielectric layers, the dielectric layer uniformity within wafer and wafer to wafer creates difficulty in accurately making fuse openings.

Another important challenge is to improve the reliability and yields of the semiconductor devices surrounding openings in insulating layers, such as openings over fusible links. A problem with openings is that moisture and other contaminants can diffuse from the openings into the device areas thus reducing circuit reliability and yields.

The importance of overcoming the two major problems of (1) forming fuse openings of a uniform depth and (2) moisture diffusing through fuse windows to circuit areas, noted above is evidenced by the extensive technological development directed to the subject, as documented by the relevant patent and technical literature. The closest and apparently more relevant technical developments in the patent literature can be gleaned by considering U.S. Pat. No. 4,536,949 (Takayama) that shows a method for a multi-layer wiring having opening for fuse. U.S. Pat. No. 5,567,643 (Lee) teaches a guard ring around a fuse opening. U.S. Pat. No. 5,457,059 (Keller) shows a metal fuse. U.S. Pat. No. 5,444,012 (Yoshizumi et al.) shows a guard ring. However, the first and second layers are not bonded to each other and therefore allow moisture to diffuse to the active devices. See Yoshizumi Figure 34. Unfortunately, the problem of contaminants diffusing to the semiconductor devices through the fuse window still exists and an improved structure/method of forming a guard ring is still needed.

SUMMARY OF THE INVENTION

It is an object of the present invention to provide a method for fabricating a fuse located on a dielectric layer (IMD or ILD) that is above the field oxide layer that reduces the depth of the fuse opening 88.

It is an object of the present invention to provide a method for fabricating a metal fuse that is formed from a metal layer and is connect to an underlying polysilicon layer by fuse plugs.

It is an object of the present invention to provide a method for fabricating a metal fuse that is formed from a metal layer connect to an underlying polysilicon layer and has a metal guard ring structure surrounding a fuse opening in inter metal dielectric layers.

It is an object of the present invention to provide a method that is easy for a designer to metal fuses in any metal layer (e.g., M1 or M2 or M3 etc.).

To accomplish the above objectives, the present invention provides a method of fabricating a guard ring (e.g., 139 149 159) around for a metal fuse 141. Key features of the invention include:

1. The metal fuse 41 is formed from a metal layer (e.g., 31, 42 (M2), 50(M3), etc.). The metal fuse is formed on an inter metal dielectric (IMD) layer that reduces the depth of the fuse opening 88 (See FIG. 3 and 4). The fuse 41 is connected to an underlying polysilicon layer 22A 22B by fuse interconnects 129A 129B 138A 138B. This contrasts with metal fuses that are electrically connected to overlying metal layers or metal fuses formed in the top level metal.

2. A metal guard ring (e.g., plugs and metal lines, 32 36 42 48 59 56 60) is formed around the metal fuse 41 141 241 to prevent moisture diffusing to product devices.

The invention for forming a metal fuse and guard ring comprises the following steps:

a) See FIGS. 1 and 2—providing a substrate 10 having at least circuit areas 86 and isolation areas and a fuse area 84 over at least one of the isolation areas;

b) forming an patterned polysilicon layer comprising a first polysilicon line 22A and a second polysilicon line 22B over at least the fuse area 84 insulated (e.g., 20) from a substrate 10;

c) forming one or more levels of fuse interconnects (e.g., first fuse interconnects 129A 129B) electrically connected to the first polysilicon line 22A and the second polysilicon line 22B; the fuse interconnects 129A 129B passing through an insulating layer 124 134;

d) simultaneously forming a metal fuse 141 connecting the polysilicon interconnects 129A 129B over the fuse area 84 and forming a metal wire layer (not shown) over the circuit areas 86;

e) forming a dielectric layer 144 over the metal fuse 141 and the first metal layer;

f) forming a guard ring around the fuse areas 84; the guard ring composed of a plurality of metal wiring layers 139 149 159 formed on and through a plurality of dielectric layers 134 144 154; and g) forming a fuse opening 88 through at least a portion of the plurality of dielectric layers 134 144 154 in the fuse area.

A preferred embodiment for forming a metal fuse with a second metal layer (See FIG. 3) is described as follows;

a) See FIG. 3—providing an isolation region 20 over at least a fuse area 84 in a substrate 10; the fuse area surrounded by a circuit area where semiconductor devices are formed;

b) forming a first polysilicon line 22A and a second polysilicon line 22B on the isolation region 20 partially across the fuse area;

c) forming a first insulating layer 24 over the first polysilicon line 22A, the second polysilicon line 22B and the isolation region 20;

d) forming first fuse plugs 28A 28B contacting the first polysilicon line 22A and the second polysilicon line 22B through the first insulating layer 24;

e) forming first level metal fuse lines 31A 31B on the first fuse plugs 28A 28B and forming a first level metal layer 32 (M1) on the first insulating layer 24 in the circuit area and;

f) forming a second insulating layer 34 over the first level metal layer, 32 (M1) the first level metal fuse lines 31A 31B and the first insulating layer 26;

g) forming second fuse plugs 38A 38B contacting the first level metal fuse lines 31A 31B through vias the second insulating layer 44; and forming first metal plugs 36 contacting the first level metal layer 32 through vias the second insulating layer 44 in the circuit area;

h) forming a second level metal fuse 41 contacting the second fuse interconnects 38A 38B; and forming a second metal layer 42 (M2) over the first metal plugs 36 and the second insulating layer in the circuit area;

i) forming a third insulating layer 44 over the second metal layer 42 and the second level metal fuse 41;

j) forming a dielectric layer over the third insulating layer 44;

k) forming a fuse opening 88 through the dielectric layer, and through a portion of the third insulating layer 44 over of the second level metal fuse 41.

A general description for forming a metal fuse (on any metal layer) with a surround guard ring is described as follows:

a) See FIG. 1—providing a substrate 10 having a fuse area surrounded by a guard ring area 8584; the guard ring area 85 surrounded by a circuit area 86; the circuit area 86 is where semiconductor devices are formed 86;

b) See FIG. 1—forming an patterned polysilicon layer, comprising a first polysilicon line 22A and a second polysilicon line, 22B over at least the fuse area 84 insulated (e.g., 20) from the substrate 10;

c) forming one or more levels of fuse interconnects (e.g., first fuse interconnects 129A 129B) in vias in one or more insulating layers (e.g., 124 134) over the substrate;

the fuse interconnects electrically connected to the first polysilicon line 22A and the second polysilicon line 22B;

d) simultaneously forming a metal fuse 141 and a first level guard ring over the insulating layers; the metal fuse the connected to the fuse interconnects 129A 129B over the fuse area; the first level guard ring formed over the guard ring area;

e) forming a first dielectric layer 144 over the metal fuse 141 and the first level guard ring 139;

f) forming a guard ring around the fuse areas 84; the guard ring composed of a plurality of metal wiring layers 149 159 formed on and through a plurality of dielectric layers (e.g., 154 172);134 144 154; the plurality of dielectric layers formed over the first dielectric layer 144; and g) forming a fuse opening 88 through at least a portion of the a plurality of dielectric layers 134 144 154 over the fuse area 84.

A general description for forming a guard ring 32 34 36 42 48 50 56 60 and metal fuse 41 using metal lines and plugs is as follows:

a) See FIG. 1—providing an isolation region 20 over at least a fuse area 84 in a substrate 10; the fuse area surrounded a guard ring area 85; the guard ring area 85 surrounded by circuit areas 86 where semiconductor devices are formed;

b) forming a first polysilicon line 22A and a second polysilicon line 22B on the isolation region 20 partially across the fuse area;

c) forming a first insulating layer 24 over the first polysilicon line 22A, the second polysilicon line 22B and the isolation region 20;

d) forming first fuse plugs 28A 28B contacting the first polysilicon line 22A and the second polysilicon line 22B through the first insulating layer 24;

e) forming a first level metal layer 32 (M1) on the first insulating layer 24 and first level metal fuse lines 31A 31B on the first fuse plugs 28A 28B; the first metal layer 32 surrounding the fuse area 84 and the first level metal fuse lines 31A 31B;

f) forming a second insulating layer 34 over the first level metal layer 32 (M1) and the first level metal fuse lines 31A 31B and the first insulating layer 26;

g) forming a first metal plug 36 contacting the first level metal layer 32 through the second insulating layer 44 and second fuse plugs 38A 38B contacting the first level metal fuse lines 31A 31B through the second insulating layer 44; the first metal plugs 36 surrounding the fuse area 84 and the second fuse plugs 38A 38B;

h) forming a second metal layer 42 (M2) over the first metal plug 36 and the second insulating layer and a second level metal fuse 41 contacting the second fuse interconnects 38A 38B; the second metal layer 42 (M2) surrounding the second level metal fusible link 41;

i) forming a third insulating layer 44 over the second metal layer 42 and the second level metal fuse 41;

j) forming a second metal plug 48 through the third insulating layer 44 contacting the second metal layer 42; the second metal plug 48 surrounding the fuse area 84;

k) forming a third level metal layer 50 contacting the second metal plug 48 (PLUG-2) and over the third insulating layer 44;

l) forming a fourth insulating layer 54 over the third level metal layer 50;

m) forming a third metal plug 56 (PLUG-3) through the fourth insulating layer 54 contacting the third level metal layer 48;

n) forming a fourth metal level layer 60 contacting the third metal plug 56 and over the fourth insulating layer 54;

o) forming a passivation layer 72 over the fourth level metal layer 60 and the fourth insulating layer 54;

p) forming a fuse window through the passivation layer 72, the fourth insulating layer 54, and through portion a of the third insulating layer 44 over of the second level metal fusible link 41.

Benefits of the Invention

The invention has the following benefits:

The fuse opening 88 is shallower because the fuse 141 is formed on a higher dielectric layer (e.g., IMD 134) not on the lower field oxide 20. This allows us to better control the remaining oxide left 143 over the fuse 141 for the fuse laser burning process.

The guard ring 139 149 159 prevents moisture and other contaminants from diffusing to the circuit areas 86.

The guard ring 139 149 159 is formed from the same metal processes/layers that form metal wiring layer in the semiconductor device.

No damage is done to the substrate from the laser burning process because the fuse 141 is formed in a high metal layer and has additional dielectric layers 134 124 between the fuse and the substrate.

The present invention achieves these benefits in the context of known process technology. However, a further understanding of the nature and advantages of the present invention may be realized by reference to the latter portions of the specification and attached drawings.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIG. 1 shows the fuse 141 formed from the second metal layer 139.

DETAILED DESCRIPTION OF THE PREFERRED EMBODIMENTS

The present invention will be described in detail with reference to the accompanying drawings. The present invention provides a method of forming a guard ring around a metal fuse. The metal fuse is above the substrate and formed from a metal layer (M1, M2, etc.).

In the following description numerous specific details are set forth such as flow rates, pressure settings, thicknesses, etc., in order to provide a more thorough understanding of the present invention. It will be obvious, however, to one skilled in the art that the present invention may be practiced without these details. In other instances, well know process have not be described in detail in order to not unnecessarily obscure the present invention.

It should be recognized that many publications describe the details of common techniques used in the fabrication process of integrated circuit components. See, E.g., C. Y. Chang, S. M. Sze, in *ULSI Technology*, by The McGraw-Hill Company, Inc. copyright 1997. Those techniques can be generally employed in the fabrication of the structure of the present invention. Moreover, the individual steps of such a process can be performed using commercially available integrate circuit fabrication machines. As specifically necessary to than understanding of the present invention, exemplary technical data are set forth based upon current technology. Future developments in the art may call for appropriate adjustments as would be obvious to one skilled in the art.

Description of the Invention—Metal Fuse Surrounded by a Guard Ring

Figure 1:
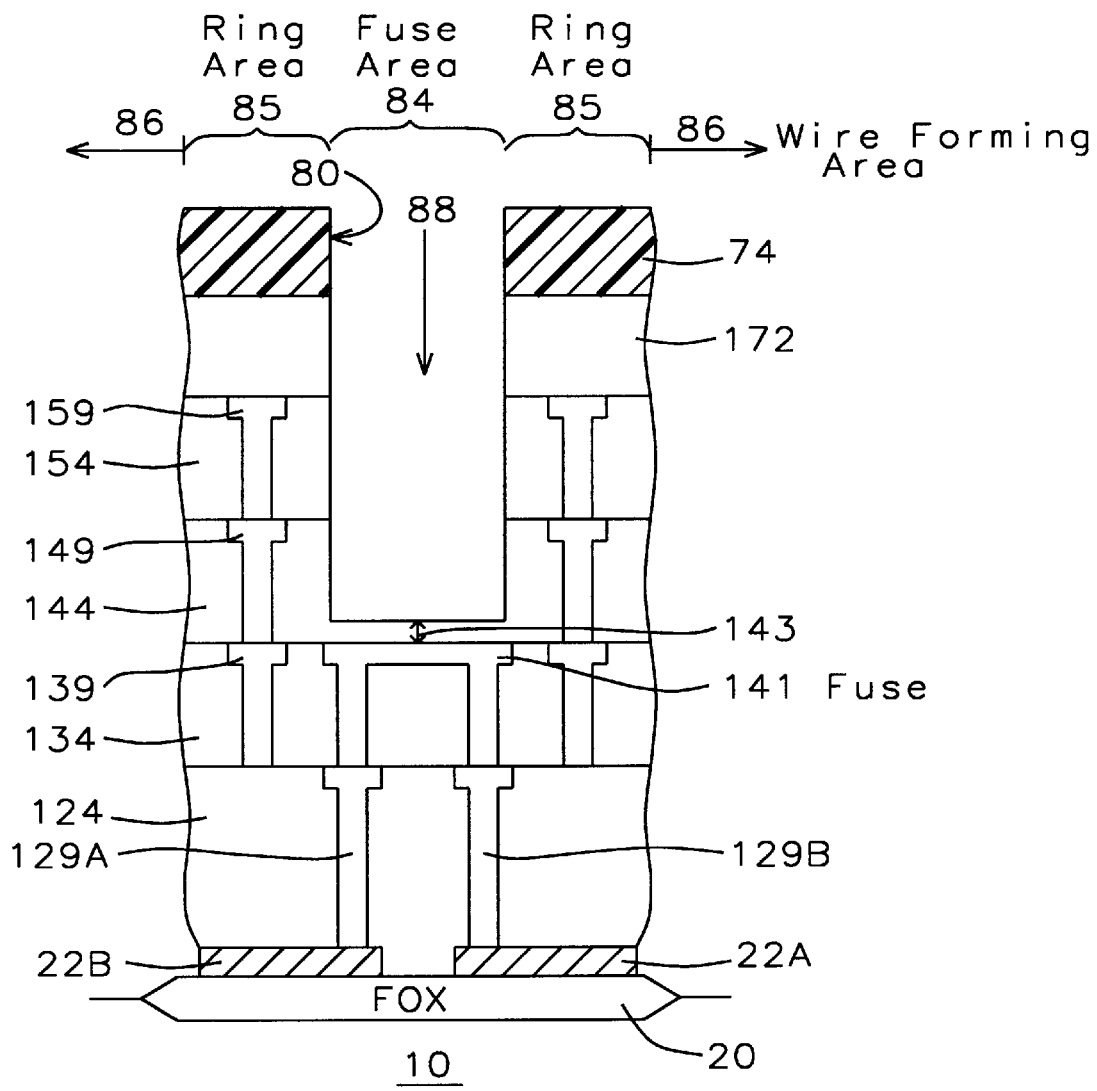
FIG. 1 is a cross sectional view for illustrating a general fuse guard ring and fuse structure and method of the present invention.

The invention has the following main points:

①A protective guard ring 139 149 159 is formed around a fuse opening 88 (See FIG. 1). The guard ring is composed of metal wiring layers (e.g., metal lines/plugs, or interconnections). Over other areas 86 of the wafer, the metal wiring layers are part of devices. The guard ring is formed through inter metal dielectric layers that overly the fuse 141.

② The fuse 41 is connected to an underlying polysilicon layer by fuse interconnections 129A 129B. In contract to prior art, the metal fuse 41 is not connected by overlying metal layers.

③ The fuse 41 is formed from a metal layer.

④ The guard ring (e.g., 139 149 159) can be formed from any number of metal layers and through any number of dielectric layers (e.g., 134 144 154).

⑤ The metal fuse 141 can be formed from any metal layer (e.g., M1, M2, M3, M4).

Figure 2:
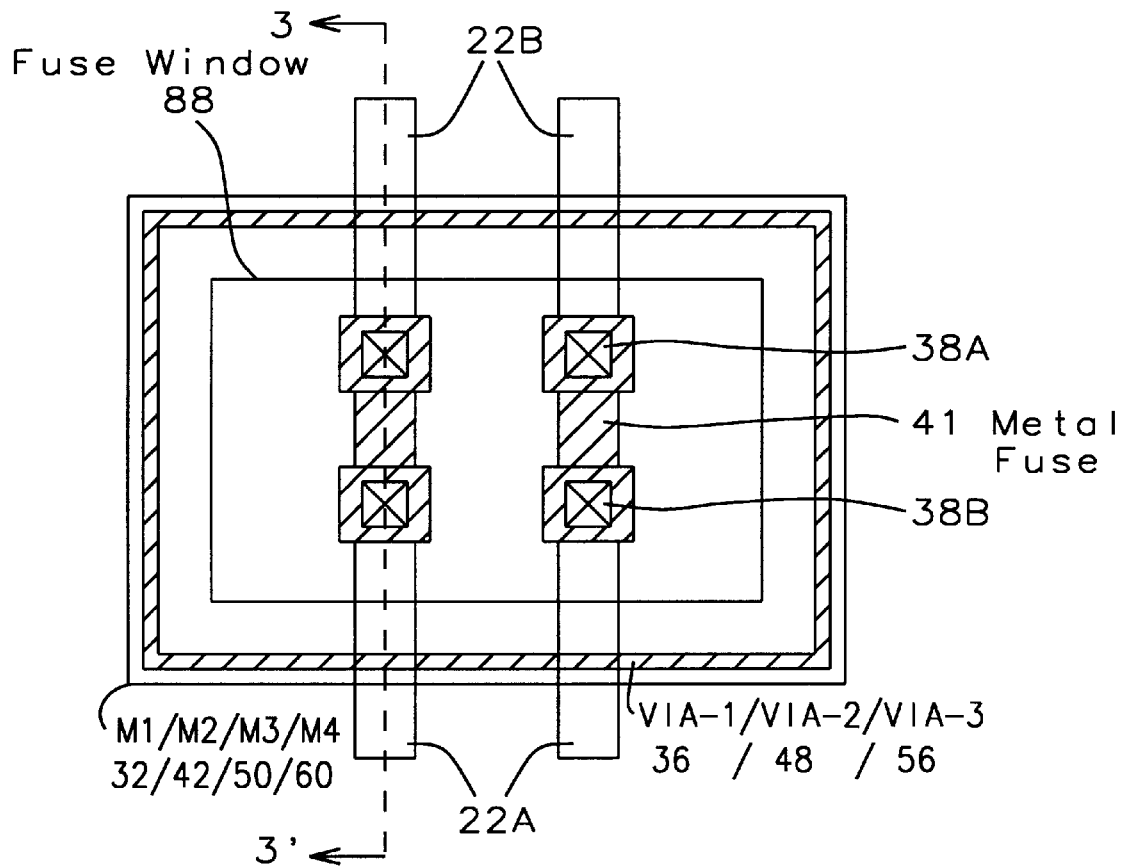
FIG. 2 is a top down view for illustrating the fuse guard ring structure and method of the present invention.

The general method of fabrication of a guard ring (e.g., 139 149 159 ) around a metal fuse 141 formed form a metal wiring layer can be generally describe as follows:

As shown in FIGS. 1 and 2, a substrate 10 is provide having at least circuit areas 86 (e.g., product wiring areas 86), isolation areas, and a fuse area 84 over at least one the isolation area. A guard ring area 85 surrounds the fuse area. The guard ring area is where the guard ring will be formed. The circuit area 86 surrounds the guard ring area 85. In the isolation areas, isolation regions (i.e., FOX or STI) are formed. In the circuit areas, semiconductor devices are formed such as FET, metal wiring layers, DRAM, logice circuits, dielectric layers etc. The guard ring of the invention prevents moisture and contamination from diffusing from the fuse areas into the circuit areas 86.

A polysilicon layer is patterned to comprise a first polysilicon line 22A and a second polysilicon line 22B is formed over at least the fuse area 84 insulated (e.g., 20) from a substrate 10. The first and second poly lines are spaced. The first and second poly lines are subsequently electrically connected by a metal fuse. The polysilicon lines can be formed of various polysilicon containing materials, such as polycides and suicides.

Fuse Interconnects

In this patent, as in general industry terminology, an interconnect can be comprise a plug (filling a via hole in a dielectric layer) together with a overlying metal line. E.g., See FIG. 3 where plug 48 and metal line 42 comprise an interconnect. Alternately, an interconnect can be formed of one metal layer filling a via hole and the same metal layer can be a metal line over a dielectric layer. See FIG. 4 where interconnect 49 connects to interconnect 139 through a via and also forms a metal line on top of IMD layer 134. Interconnects can be formed by many processes including single or dual damascene processes.

Figure 3:
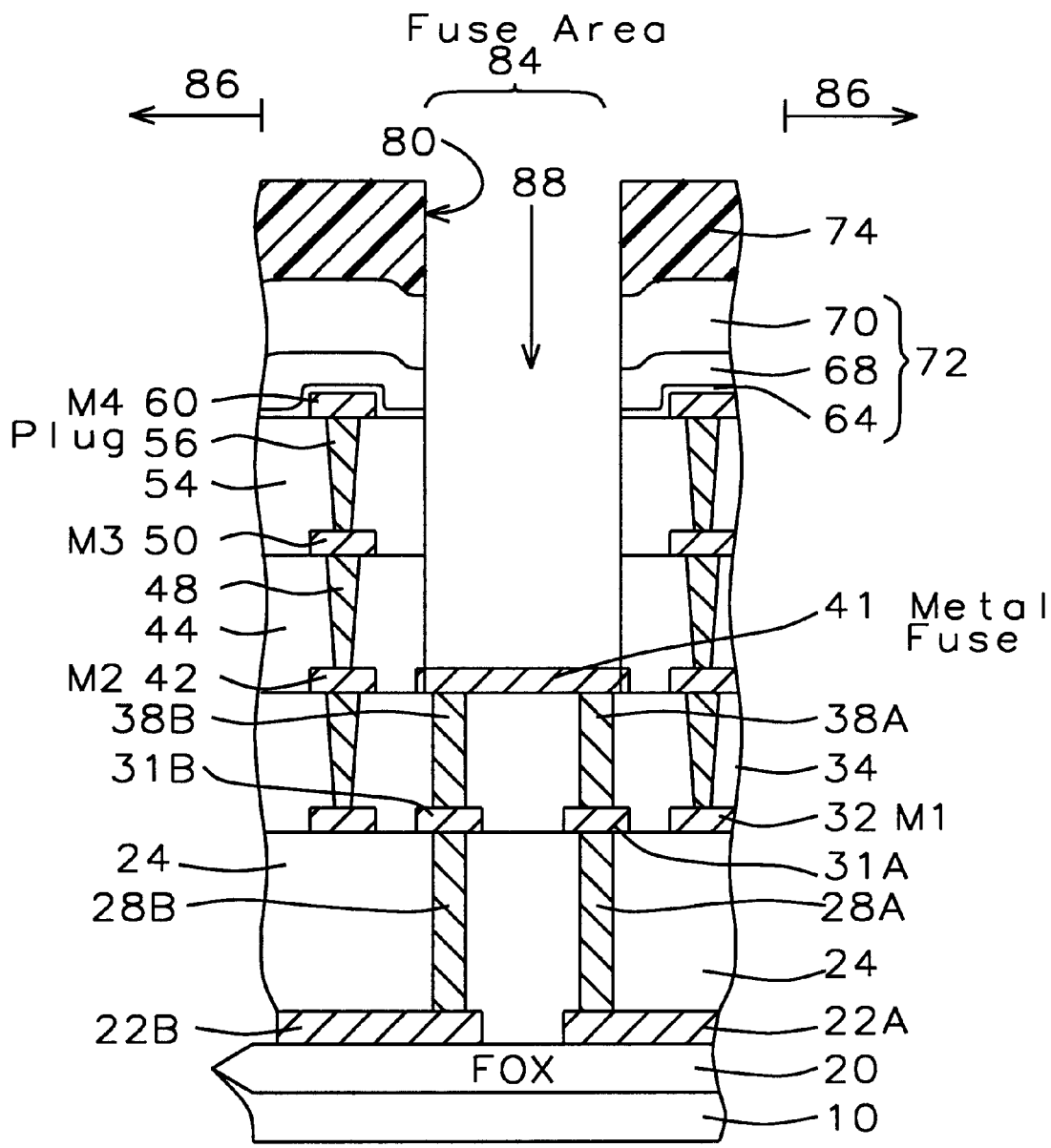
FIG. 3 is a cross sectional view taken along axis 3/3' in FIG. 2 for illustrating a preferred fuse guard ring structure and method of the present invention where the fuse is formed in a second level metal.

One or more levels of fuse interconnects (e.g., first fuse interconnects 129A 129B) electrically connected to the first polysilicon line 22A and the second polysilicon line 22B. The fuse interconnect can be formed form one or more conductive layers and is not limited in composition and structure as future metallization technologies evolve. The fuse interconnects are represented as one conductive layer 129A 129 B in FIG. 1. In FIG. 3 the fuse interconnects are shown as 2 conductive layers 28A 28B (plugs) and metal fuse lines 31A 31B. The interconnects can be formed of polysilicon or metals, such as, but not limited to Al, W, TiN, Silicides, and metal alloys. Also, interconnects, plugs and metal lines can be comprised of other layers, such as barrier layers and adhesion layers, etc.

The fuse interconnects 129A 129B pass through an insulating layer 24 34 (eg., interlevel dielectric (IDL) Layer) in via openings. The fuse interconnects can be formed by conventional photolithographic processes or by advanced damascene and other processes. Fuse interconnects formed are preferably formed from polysilicon layers. The polysilicon layer is also patterned in devices areas 86 to form device structures such as capacitors, bit-lines, resistors, interconnections.

Metal Fuse

A metal fuse 141, fuse guard ring 139, and device metal wiring lines (in the circuit areas 86 (e.g., device wiring area 86)) are formed. The metal fuse 141 electrically connects the polysilicon interconnects 129A 129B over the fuse area 84.

A dielectric layer (e.g., 144 or 154 ) is formed over the metal fuse 141 and the first metal layer 134. The dielectric layer can comprise one or more dielectric layers (inter metal dielectric layers) and is not limited to the configurations shown in FIGS. 1, 3 and 4.

Guard Ring 139 149 159

A guard rings are formed around the fuse areas 84. The guard ring are composed of a plurality of metal wiring layers 139 149 159 (e.g. interconnects or plug/lines) formed on and through a plurality of dielectric layers 134 144 154. The guard rings are formed from the same metal layers used to form metal lines for devices in circuit areas (wiring areas) 86 outside of the fuse area 84. The metal guard rings can be formed by any structure and material as technology evolves. For example, the guard rings (and metal layer used to form product devices in the circuit areas (wire forming areas) 86) can be formed from one conductive layer using a dual damascene process or as shown in FIG. 3 using a plug (e.g. Al, W, TiN or metal alloy) 36 50 60 and metal line (e.g., Al alloy) (32 48 56).

The fuse and guard ring are formed from metal layers that patterned over the device areas 86 that comprise interconnects, plugs and metal lines in product semiconductor circuits.

Fuse Opening

A fuse opening 80 is etched through at least a portion of the plurality of dielectric layers 134 144 154 in the fuse area. The fuse opening 80 preferably does not expose the fuse 141, but leaves a first thickness 143 of dielectric layer over the fuse 141 in a range of between about 1000 and 12,000 Å.

Example 1—Fuse Formed in Metal 2 Layer

A preferred embodiment of the invention is shown in FIGS. 2 and 3. The preferred embodiment forms the metal fuse 41 in the second metal layer (M2) and shows a guard ring formed from the 2nd, 3rd and 4th metal layers.

FIG. 3 shows a cross section of a preferred embodiment where the metal fuse 44 is formed from the second metal layer (M2). FIG. 2 shows a top down view of the guard ring and metal fuse.

As shown in FIG. 3, an isolation region 20 is formed over at least a fuse area 84 in a substrate 10.

Next, a first polysilicon line 22A and a second polysilicon line 22B are formed on the isolation region 20 partially across the fuse area. The polysilicon lines preferably have a thickness in a range of between about 300 and 3000 Å. The polysilicon layer 22 be formed of other materials, such as polycides, silicides, Ti Silicide, etc.

A first insulating layer 24 (interlevel dielectric (ILD)) is formed over the first polysilicon line 22A, the second polysilicon line 22B and the isolation region 20. The first insulating layer 24 preferably has a thickness in a range of between about 5000 and 50,000 Å(tgt=15,000 Å).

First fuse plugs 28A 28B are formed contacting the first polysilicon line 22A and the second polysilicon line 22B through the first insulating layer 24. Via holes are formed in the 1 st insulating layer 24 and filled with conductive material. The first fuse interconnects 28 are composed of Polysilicon, metals or poly plugs.

A first level metal layer 32 (M1) is formed on the first insulating layer 24 and first level metal fuse lines 31A 31B on the first fuse plugs 28A 28B. The first metal layer (e.g., guard ring) 32 surrounds the fuse area 84 and the first level metal fuse lines 31A 31B. The first metal layer is simultaneously formed on the circuit areas 86 and patterned to form metal lines.

A second insulating layer 34 (IMD 1) is formed over the first level metal layer 32 (M1) and the first level metal fuse lines 31A 31B and the first insulating layer 26.

First metal plugs 36 are formed contacting the first level metal layer 32 through the second insulating layer 44; and second fuse plugs 38A 38B contact the first level metal fuse lines 31A 31B through the second insulating layer 44. The first metal plugs 36 surround the fuse area 84 and the second fuse plugs 38A 38B.

A second metal layer 42 (M2) is formed over the first metal plugs 36 and the second insulating layer and a second level metal fuse 41 contacting the second fuse interconnects 38A 38B. The second metal layer 42 (M2) (guard ring) surrounds the second level metal fusible link 41.

A third insulating layer 44 (IMD 3)is formed over the second metal layer 42 and the second level metal fuse 41.

A second metal plug 48 is formed through the third insulating layer 44 in via holes contacting the second metal layer 42. The second metal plug 48 surrounds the fuse area 84. A third level metal layer 50 is formed contacting the second metal plug 48 (PLUG-2) and over the third insulating layer 44.

A fourth insulating layer 54 is formed over the third level metal layer 50. A third metal plug 56 is formed through the fourth insulating layer 54 in via holes contacting the third level metal layer 48.

A fourth metal level layer 60 is formed contacting the third metal plug 56 and over the fourth insulating layer 54.

A passivation layer 72 is formed over the fourth level metal layer 60 and the fourth insulating layer 54. The passivation layer 72 is preferably comprised of a three layer structure: (a) a first silicon nitride layer 64 preferably having a thickness in a range of between about 300 and 5000 Å, (b) a spin-on-glass layer 68 preferably having a thickness in a range of between about 2000 and 10,000 Å and (c) a second silicon nitride layer 70 preferably having a thickness in a range of between about 1000 and 10,000 Å.

A fuse window 88 is formed through the passivation layer 72, the fourth insulating layer 54, and through portion of the third insulating layer 44 over of the second level metal fusible link 41. The fuse window 88 can expose the fuse of leave some thickness of dielectric layer over the fuse.

It is obvious that while we are forming the guard ring and fuse structure, that the corresponding layers (plugs, lines, interconnects) are being formed in the circuit areas 86 to form product devices/circuits. For example, device metal lines in the circuit areas are simultaneously formed while forming the first level metal layer, the second metal layer, the third level metal layer. Also, lugs in the circuit area are formed simultaneously while forming the first metal plugs 36, the second metal plugs, and the third metal plugs.

The table below is a list of preferred thickness for the various layers shown in FIG. 3.

Table of preferred parameters - Thickness

| element | name | parameter | unit | target | low limit | high limit |
|---|---|---|---|---|---|---|
| 22A 22B | a first polysilicon line 22A and a second polysilicon line 22B | thickness | Å | 500 | 300 | 10,000 |
| 26 | a first insulating layer 24 | thickness | Å | 15,000 | 5000 | 50000 |
| 28A 28b | first fuse plugs 28A 28B | thickness | Å | 5000 | 1000 | 10000 |
| 32 31A 31B | first level metal layer 32 (M1) and first level metal fuse lines 31A 31B | | | | | |
| 34 | a second insulating layer 34 | thickness | Å | 15,000 | | |
| 42 41 | second metal layer 42 (M2) and second level metal fuse 41 | | | | | |
| 44 | a third insulating layer 44 | | | | | |
| 50 | third level metal layer 50 | | | | | |
| 64 | fourth insulating layer 54 | thickness | Å | 15,000 | | |
| 56 | third metal plug 56 | | | | | |
| 60 | a fourth metal layer 60 M4 | | | | | |
| 64 | first silicon nitride layer 64 | thickness | Å | | 300 | 5000 |
| 68 | spin-on-glass layer 68 | thickness | Å | | 2000 | 10000 |
| 70 | second silicon nitride layer 70 | thickness | Å | | 1000 | 10,000 |

The table below has a list of preferred compositions and process for the layers shown in FIG. 3.

Table of preferred parameters - compositions and processes

| element | name | preferred composition/ structure | Alternate compositions | preferred processes |
|---|---|---|---|---|
| 22A 22B | a first polysilicon line 22A and a second polysilicon line 22B | Polysilicon | Polycide, amorphous Si, Ti Silicide | Polycide |
| 24 | a first insulating layer 26 | PETEOS oxide | BPTEOS, SACVD oxide | PE-TEOS oxide |
| 28A 28b | first fuse plugs 28A 28B | polysilicon | W-Plug, Poly plug | W plug |
| 32 31A 31B | first level metal layer 32 (M1) and first level metal fuse lines 31A 31B | | | |
| 34 | a second insulating layer 34 | PETEOS oxide | | PETEOS |
| 42 41 | second metal layer 42 (M2) and second level metal fusible link 41 | | | |
| 44 | a third insulating layer 44 | | | |
| 48 | second metal plug 48 | | | |
| 50 | third level metal layer 50 | | | |
| 64 | fourth insulating layer 54 | PETEOS oxide | | PETEOS |
| 56 | third metal plug 56 | | | |
| 60 | a fourth metal level layer 60 | | | |

-continued

Table of preferred parameters - compositions and processes

| element | name | preferred composition/ structure | Alternate compositions | preferred processes |
| --- | --- | --- | --- | --- |
| 64 | first silicon nitride layer 64 | SiN | PETEOS | SiON |
| 68 | spin-on-glass layer 68 | spin-on-glass | SACVD, PETEOS | SOG |
| 70 | second silicon nitride layer 70 | SiN | | |
| 72 | a passivation layer 72 | SiN/SOG/SiN | PESiON/SOG/SiN PESION/SACVID/SiN | PEOX/SiN |

Figure 4:
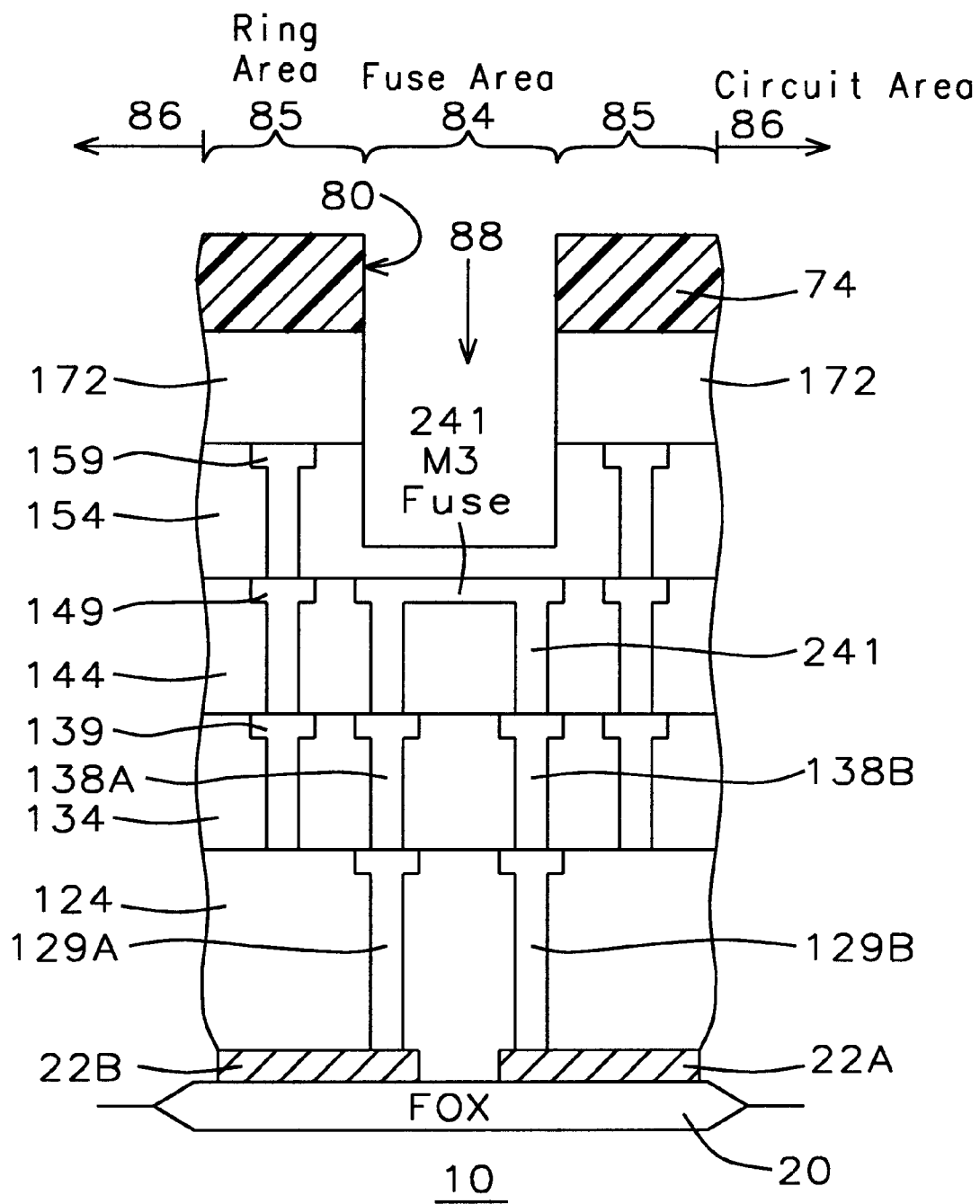
FIG. 4 is a cross sectional view for illustrating a preferred fuse guard ring structure and method of the present invention where the fuse is formed in a third level metal.

Example of a Metal Fuse Formed in the Third Level Metal—FIG. 4

The metal fuse of the invention can be formed with any metal layer (M1, M2, etc.) FIG. 4 shows an example of the fuse 241 formed in third level metal (M3). The elements and methods for FIG. 4 are the same as described for FIG. 3 with the exceptions that the metal fuse 241 is formed with the third metal layer (e.g.,. with 149 M3 wiring). The fuse 241 is connected first fuse interconnections 129A 129B and second fuse interconnections 138A 138B. As with the other Figs, the interconnections 138A 138B 129A 129B can comprise a plug and an metal layer. That is the fuse 241 can be formed of a 3rd level metal and W plugs.

A major advantage of forming the metal fuse in higher level metal layer is that the fuse opening 88 is not so deep and can be more accurately controlled. The more consistent dielectric layer thickness over the fuse allow the laser to more consistently cut fuse which increases yields While the invention has been particularly shown and described with reference to the preferred embodiments thereof, it will be understood by those skilled in the art that various changes in form and details may be made without departing from the spirit and scope of the invention.

What is claimed is:

1. A method of fabricating a metal fuse with a second level metal layer; comprising the steps of:
   a) providing an isolation region over at least a fuse area in a substrate; said fuse area surrounded by a circuit area where semiconductor devices are formed;
   b) forming a first polysilicon line and a second polysilicon line on said isolation region partially across said fuse area;
   c) forming a first insulating layer over said first polysilicon line, said second polysilicon line and said isolation region;
   d) forming first fuse plugs contacting said first polysilicon line and said second polysilicon line through said first insulating layer;
   e) forming first level metal fuse lines on said first fuse plug sand forming a first level metal layer on said first insulating layer in said circuit area and;
   f) forming a second insulating layer over said first level metal layer, said first level metal fuse lines and said first insulating layer;
   g) forming second fuse plugs contacting said first level metal fuse lines through vias said second insulating layer; and forming first metal plugs contacting said first level metal layer through vias said second insulating layer in said circuit area;
   h) forming a second level metal fuse contacting said second fuse interconnects; and forming a second metal layer over said first metal plugs and said second insulating layer in said circuit area;
   i) forming a third insulating layer over said second metal layer and said second level metal fuse;
   j) forming a dielectric layer over said third insulating layer;
   k) forming a fuse opening through said dielectric layer, and through a portion of said third insulating layer over of said second level metal fuse.

2. A method of fabricating a guard ring around a metal fuse formed from a metal layer, comprising the steps of:
   a) providing a substrate having a fuse area surrounded by a guard ring area; said guard ring area surrounded by a circuit area; said circuit area is where semiconductor devices are formed;
   b) forming an patterned polysilicon layer, comprising a first polysilicon line and a second polysilicon line, over at least said fuse area insulated from said substrate;
   c) forming one or more levels of fuse interconnects in vias in one or more insulating layers over said substrate; said fuse interconnects electrically connected to said first polysilicon line and said second polysilicon line;
   d) simultaneously forming a metal fuse and a first level guard ring over said insulating layers; said metal fuse the connected to said fuse interconnects over said fuse area; said first level guard ring formed over said guard ring area;
   e) forming a first dielectric layer over said metal fuse and said first level guard ring;
   f) forming a guard ring around said fuse areas; said guard ring composed of a plurality of metal wiring layers formed on and through a plurality of dielectric layers; said plurality of dielectric layers formed over said first dielectric layer; and
   g) forming a fuse opening through at least a portion of said a plurality of dielectric layers over said fuse area.

3. A method of fabricating a guard ring around a metal fuse comprising the steps of:
   a) providing an isolation region over at least a fuse area in a substrate; said fuse area surrounded by a guard ring area; said guard ring area surrounded by circuit areas where semiconductor devices are formed;
   b) forming a first polysilicon line and a second polysilicon line on said isolation region partially across said fuse area;
   c) forming a first insulating layer over said first polysilicon line, said second polysilicon line and said isolation region;
   d) forming first fuse plugs contacting said first polysilicon line and said second polysilicon line through said first insulating layer;

e) forming a first level metal layer on said first insulating layer and first level metal fuse lines on said first fuse plugs; said first metal layer surrounding said fuse area and said first level metal fuse lines;

f) forming a second insulating layer over said first level metal layer and said first level metal fuse lines and said first insulating layer;

g) forming a first metal plug contacting said first level metal layer through said second insulating layer and second fuse plugs contacting said first level metal fuse lines through said second insulating layer; said first metal plugs surrounding said fuse area and said second fuse plugs;

h) forming a second metal layer over said first metal plug and said second insulating layer and a second level metal fuse contacting said second fuse interconnects; said second metal layer surrounding said second level metal fusible link;

i) forming a third insulating layer over said second metal layer and said second level metal fuse;

j) forming a second metal plug through said third insulating layer contacting said second metal layer; said second metal plug surrounding said fuse area;

k) forming a third level metal layer contacting said second metal plug and over said third insulating layer;

l) forming a fourth insulating layer over said third level metal layer;

m) forming a third metal plug through said fourth insulating layer contacting said third level metal layer;

n) forming a fourth metal level layer contacting said third metal plug and over said fourth insulating layer;

o) forming a passivation layer over said fourth level metal layer and said fourth insulating layer, p) forming a fuse window through said passivation layer, said fourth insulating layer, and through portion a of said third insulating layer over of said second level metal fusible link.

4. The method of claim 3 wherein said first polysilicon line and said second polysilicon line are composed of a material selected from the group consisting of polycide, Ti Silicide and amorphous silicide, and Cobalt silicide.

5. The method of claim 3 wherein said first insulating layer having a thickness in a range of between about 5000 and 50,000 Å.

6. The method of claim 3 wherein said first fuse interconnects are composed of a material selected from the group consisting of polysilicon, W plugs, and metal plugs.

7. The method of claim 3 wherein said passivation layer is comprised of a three layer structure: (a) a first silicon nitride layer having a thickness in a range of between about 300 and 5000 Å, (b) a spin-on-glass layer having a thickness in a range of between about 2000 and 10,000 Å and (c) a second silicon nitride layer having a thickness in a range of between about 1000 and 10,000 Å.

8. The method of claim 3 wherein after said fuse widow is formed; said third insulating layer has a thickness over said metal fuse in a range of between about 500 and 10,000.

9. The method of claim 3 wherein said fuse window has a width in a range of between about 1 and 50 μm and a length in a range of between about 1 and 50 μm.

10. The method of claim 3 wherein forming simultaneously device metal lines in said circuit areas while forming said first level metal layer, said second metal layer, said third level metal layer; and simultaneously forming plugs in said circuit area while forming said first metal plugs, said second metal plugs, and said third metal plugs.

* * * * *